United States Patent
Franceschini et al.

(10) Patent No.: US 10,068,639 B2
(45) Date of Patent: Sep. 4, 2018

(54) OUT-OF-PLACE PRESETTING BASED ON INDIRECTION TABLE

(71) Applicant: International Business Machines Corporation, Armonk, NY (US)

(72) Inventors: Michele M. Franceschini, White Plains, NY (US); Ashish Jagmohan, Yorktown Heights, NY (US); Moinuddin K. Qureshi, White Plains, NY (US); Luis A. Lastras, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 799 days.

(21) Appl. No.: 14/264,463

(22) Filed: Apr. 29, 2014

(65) Prior Publication Data

US 2015/0309941 A1    Oct. 29, 2015

(51) Int. Cl.
*G11C 11/418* (2006.01)

(52) U.S. Cl.
CPC ................ *G11C 11/418* (2013.01)

(58) Field of Classification Search
CPC .................................................. G11C 11/418
See application file for complete search history.

(56) References Cited

U.S. PATENT DOCUMENTS

| | | | |
|---|---|---|---|
| 7,552,272 B2 | 6/2009 | Gonzalez et al. | |
| 7,889,544 B2 | 2/2011 | Chow et al. | |
| 7,944,375 B2 | 5/2011 | Abali et al. | |
| 7,965,546 B2 | 6/2011 | Lee et al. | |
| 8,019,925 B1 | 9/2011 | Vogan et al. | |
| 2010/0095046 A1 | 4/2010 | Reid et al. | |
| 2010/0332730 A1 | 12/2010 | Royer et al. | |
| 2012/0311262 A1* | 12/2012 | Franceschini | G06F 12/0802 711/118 |

OTHER PUBLICATIONS

Qureshi et all, "Enhancing Lifetime and Security of PCM-Based Main Memory With Start-Gap Wear Leveling", Micro'09, Dec. 12-16, 2009 10 pages.
In-Hwan Choi et al., "Wear Leveling for PCM Using Hot Data Identification", Proceedings of the International Conference on IT Convergence and Security, 2011, 2 pages.
Qureshi et al., "Morphable Memory System: A Robust Architecture for Exploiting Multi-Level Phase Change Memories", ISCA'10, Jun. 19-23, 2010, Saint-Malo, France.
Qureshi, "Pay-As-You-Go: Low-Overhead Hard Error Correction for Phase Change Memories", Micro'11, Dec. 3-7, 2011, Porto Alegre, Brazil.

* cited by examiner

*Primary Examiner* — Michael Alsip
(74) *Attorney, Agent, or Firm* — Harrington & Smith (57) ABSTRACT

An aspect of this invention is a method for providing a PreSET region in a memory device wherein the PreSET region includes one or more lines of the memory device which have been PreSET; performing a write operation on one or more out of place lines of the memory device by writing to the PreSET region instead of writing to an in place line of the memory device; and storing in an indirection table a mapping of each of a respective plurality of logical pages of the memory device to a corresponding physical page of a plurality of physical pages of the memory device, wherein the indirection table keeps track of the one or more out of place lines.

24 Claims, 5 Drawing Sheets

OUT-OF-PLACE PRESETTING BASED ON INDIRECTION TABLE

TECHNICAL FIELD

The exemplary embodiments of this invention relate generally to non-volatile memory, and more particularly to out-of-place presetting based on an indirection table.

BACKGROUND

Non-volatile memory is memory that retains stored data when power is disconnected from the system. Examples of non-volatile memory include Phase-Change Memory (PCM) and flash memory. Phase Change Memory (PCM) is a promising technology for building main memory systems. A prominent characteristic of PCM is that its write latency is much greater than its read latency. Servicing these relatively slow writes causes significant contention for read requests. For a baseline PCM system, the slow writes increase the effective read latency by almost two times, causing significant performance degradation.

SUMMARY

In one aspect thereof the exemplary embodiments of this invention provide a method that includes providing a PreSET region in a memory device wherein the PreSET region includes one or more lines of the memory device which have been PreSET; performing a write operation on one or more out of place lines of the memory device by writing to the PreSET region instead of writing to an in place line of the memory device; and storing in an indirection table a mapping of each of a respective plurality of logical pages of the memory device to a corresponding physical page of a plurality of physical pages of the memory device, wherein the indirection table keeps track of the one or more out of place lines.

In another aspect thereof, the exemplary embodiments provide a computer-readable memory that contains computer program instructions, where the execution of the computer program instructions by at least one data processor results in performance of operations that comprise providing a PreSET region in a memory device wherein the PreSET region includes one or more lines of the memory device which have been PreSET; performing a write operation on one or more out of place lines of the memory device by writing to the PreSET region instead of writing to an in place line of the memory device; and storing in an indirection table a mapping of each of a respective plurality of logical pages of the memory device to a corresponding physical page of a plurality of physical pages of the memory device, wherein the indirection table keeps track of the one or more out of place lines.

In yet another aspect thereof, the exemplary embodiments provide a data processing system that comprises at least one data processor connected with at least one memory that stores computer program instructions for providing a PreSET region in a memory device wherein the PreSET region includes one or more lines of the memory device which have been PreSET; performing a write operation on one or more out of place lines of the memory device by writing to the PreSET region instead of writing to an in place line of the memory device; and storing in an indirection table a mapping of each of a respective plurality of logical pages of the memory device to a corresponding physical page of a plurality of physical pages of the memory device, wherein the indirection table keeps track of the one or more out of place lines.

DETAILED DESCRIPTION

Figure 1A:
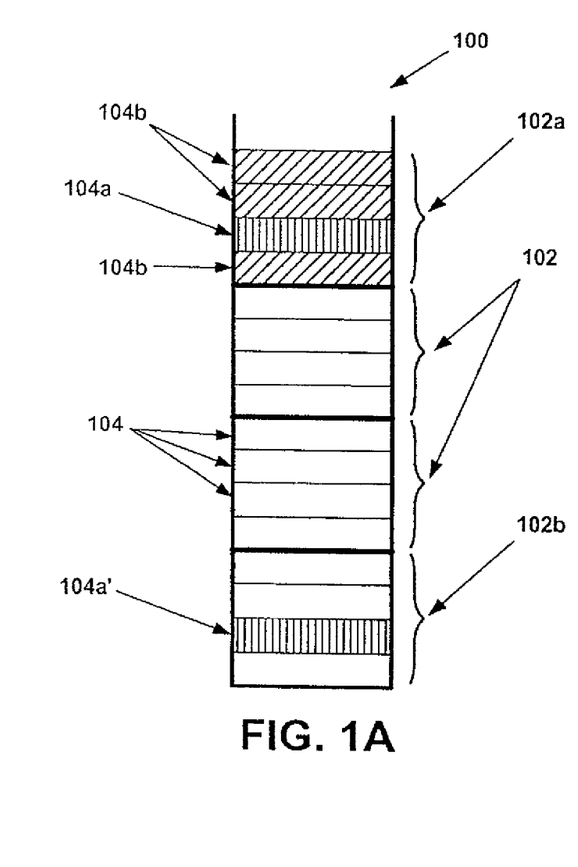
FIG. 1A is a simplified diagrammatic representation showing an exemplary non-volatile memory.

FIG. 1A is a diagram showing a non-volatile memory 100. The non-volatile system 100 includes a plurality of memory blocks 102, with each memory block comprising a plurality of memory pages 104. To update the data in a page 104a of a memory block 102a, for example, the non-volatile memory controller locates a previously erased memory block, such as memory block 102b, in which to store the data from page 104a once updated. To update the data in memory page 104a, the data from memory page 104a is transferred to the system data buffer where the data is updated. The updated page data then is read from the system data buffer and written to the corresponding memory page 104a' in the new memory block 102b. After the updated data is stored in the new page 104a' of the new block 102b, the remainder of the memory pages from the original memory block 102a are transferred to the new memory block 102b, as illustrated next with reference to FIG. 1B.

Figure 1B:
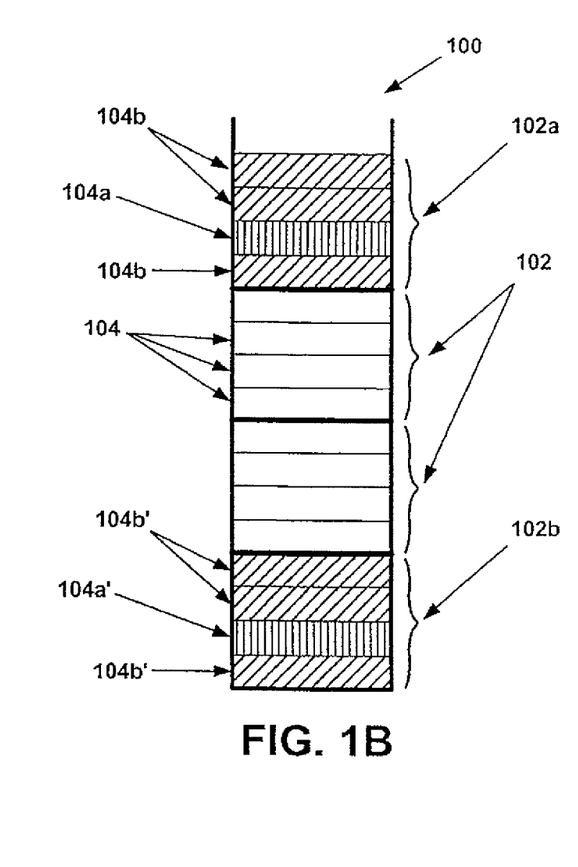
FIG. 1B illustrates the non-volatile memory of FIG. 1A after a data transfer operation has been performed.

FIG. 1B is a diagram showing the non-volatile memory 100 after transferring the remaining data in the original memory block 102a to the new memory block 102b. As discussed previously, the non-volatile memory 100 includes a plurality of memory blocks 102, with each memory block comprising a plurality of memory pages 104. Once the update page data is written to the new memory page 102b, the data in the remainder of the memory pages 104b of the original memory block 102a needs to be transferred to the new memory block 102b. Thus, in the example of FIG. 1B, for each of the remaining memory pages 104b of original memory block 102a, the data is transferred from each old memory page 104b to the corresponding new memory page 104b' in the new memory block 102b. Thereafter, when time permits, the original memory block 102a can be erased.

The process described with reference to FIGS. 1A and 1B may be performed whether the entire memory page 104a is updated, or whether a single byte of data in memory page 104a is updated. In both cases, the entire memory block 102a is copied to the new memory block 102b. Since an exemplary memory block typically includes sixty-four memory pages, the operations described previously require: 1) 1 write of the new page data to the new page 104a' in the new block 102b, 2) 63 reads for the remaining pages in the original memory block 102a, and 3) 63 writes of the pages to the new memory block 102b.

The problem of slow writes in non-volatile memory devices can be alleviated by exploiting a property of Phase Change Memory (PCM) devices wherein writes are slow only in one direction and are almost as fast as reads in the other direction. For example, writes are slow in the context of a SET operation but are faster in the context of a RESET operation. Therefore, a write operation to a line in which all memory cells have been SET prior to the write will incur much lower latency compared to lines in which the memory cells have not been SET prior to the write. PreSET is an architectural technique that leverages this fundamental property to proactively SET all the bits in a given memory line in advance of the anticipated write to that memory line.

Conventional methods for using PreSET formulate a prediction as to when one or more memory locations are going to be rewritten in the future. A prospective PreSET operation is performed at each of these memory locations prior to write time. One benefit is that, at write time, only RESET operations need to be performed. These RESET operations are of lower latency and consume less power than the SET operations. Thus, the PreSET technique is used in PCMs so as to provide faster, low instantaneous power writes. A PreSET request for a memory line may be initiated as soon as that line becomes dirty in the cache, thereby allowing a large window of time for the PreSET operation to complete. However, there is a cumulative power overhead associated with PreSET operations, and thus these operations should be performed judiciously. Performing prospective PreSET operations reduces the overall flexibility of using PreSET.

Figure 2:
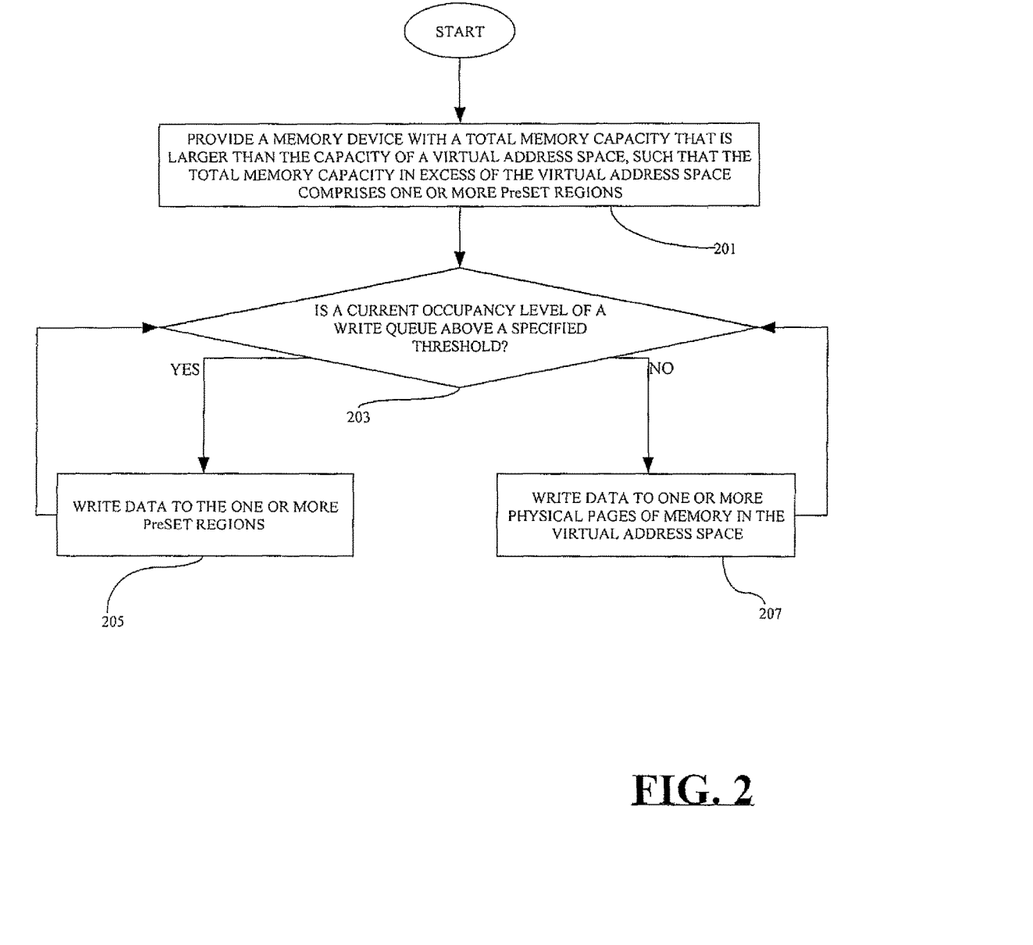
FIG. 2 is a flowchart setting forth a first illustrative method for using one or more PreSET operations to improve write performance according to a set of exemplary embodiments of the invention.

FIG. 2 is a flowchart setting forth a first illustrative method for using one or more PreSET operations to improve write performance according to a set of exemplary embodiments of the invention. At block 201, a memory device such as a PCM is provided with a total memory capacity that is larger than the capacity of a virtual address space, such that the total memory capacity in excess of the virtual address space comprises one or more PreSET regions. Next, at block 203, a test is performed to ascertain whether or not a current occupancy level of a write queue is above a specified threshold. If so, the operational sequence progresses to block 207 where data is written to one or more physical pages of memory in the virtual address space. The negative branch from block 203 leads to block 205 where data is written to the one or more PreSET regions. Since PreSET operations are associated with power and energy overheads, it is desirable that one or more PreSET regions of memory only be written to when there is a heavy pressure on the write queue. These one or more PreSET regions are consumed in response to a write queue occupancy being above a specified threshold. The one or more PreSET regions are PreSET in response to a current write bandwidth allowing for a high instantaneous bandwidth.

Figure 3:
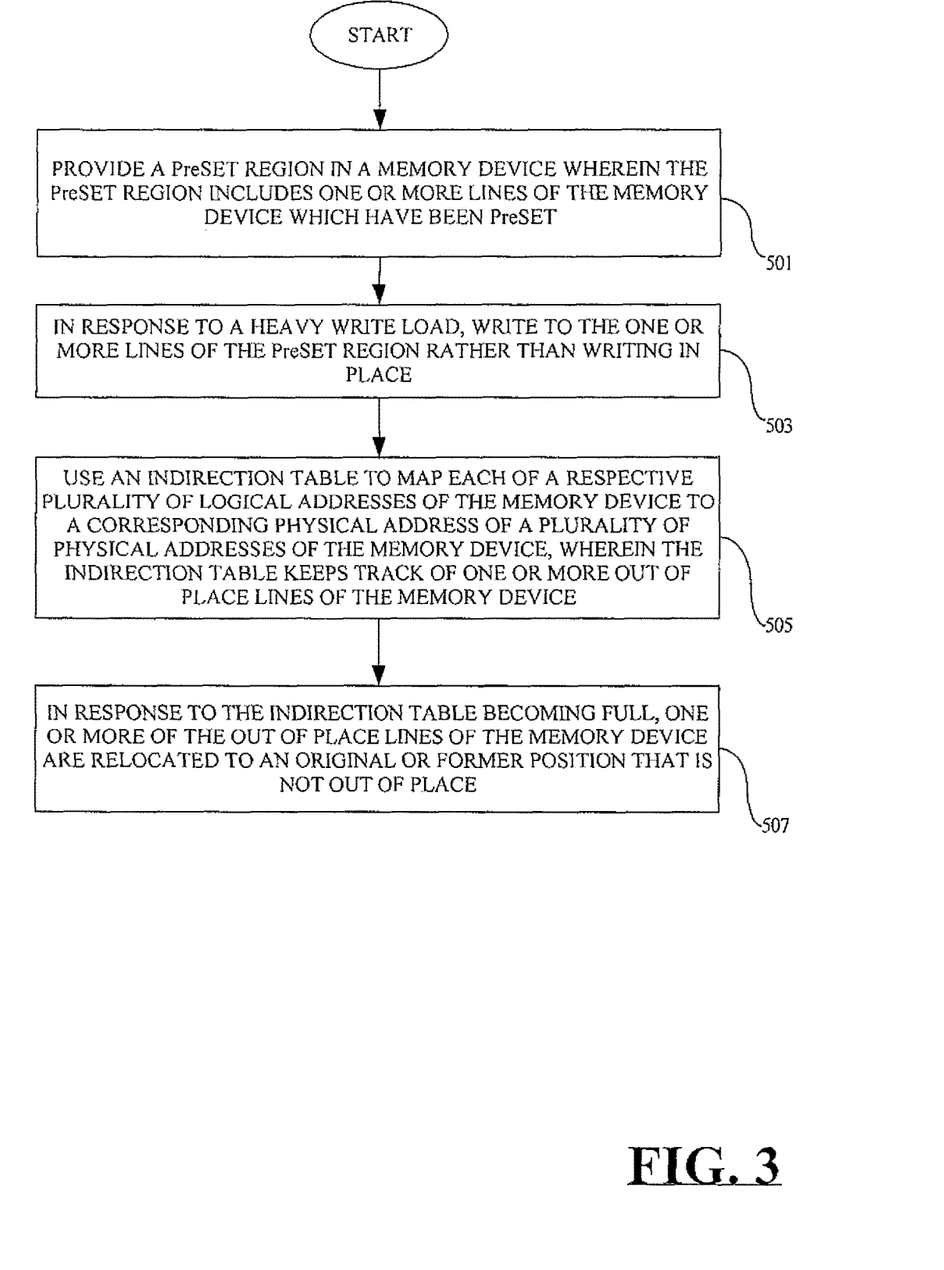
FIG. 3 is a flowchart setting forth a second illustrative method for using one or more PreSET operations to improve write performance according to a set of exemplary embodiments of the invention.

FIG. 3 is a flowchart setting forth a second illustrative method for using one or more PreSET operations to improve write performance according to a set of exemplary embodiments of the invention wherein an indirection table is used. At block 501, a PreSET region is provided in a memory device. The PreSET region includes one or more lines of the memory device which have been PreSET. The locations of these one or more lines may change over time. Next, at block 503, in response to a heavy write load, lines are written to the PreSET region rather than writing in place. This provides fast writes of high instantaneous bandwidth and smooths maximum power. The write load may be monitored, determined, and/or measured through write queue occupancy levels. At block 505, an indirection table is used to track mapping of each of a respective plurality of logical addresses of the memory device to a corresponding physical address of a plurality of physical addresses of the memory device. This indirection table may be full or partial. Using a partial indirection table, most lines are located in their original locations, but a small fraction of lines are located out of place. The indirection table keeps track of out of place lines. Illustratively, the indirection table is a small table. In response to the indirection table becoming full, one or more lines of the out of place lines of the memory device are relocated to an original or former position that is not out of place (block 509).

Figure 4:
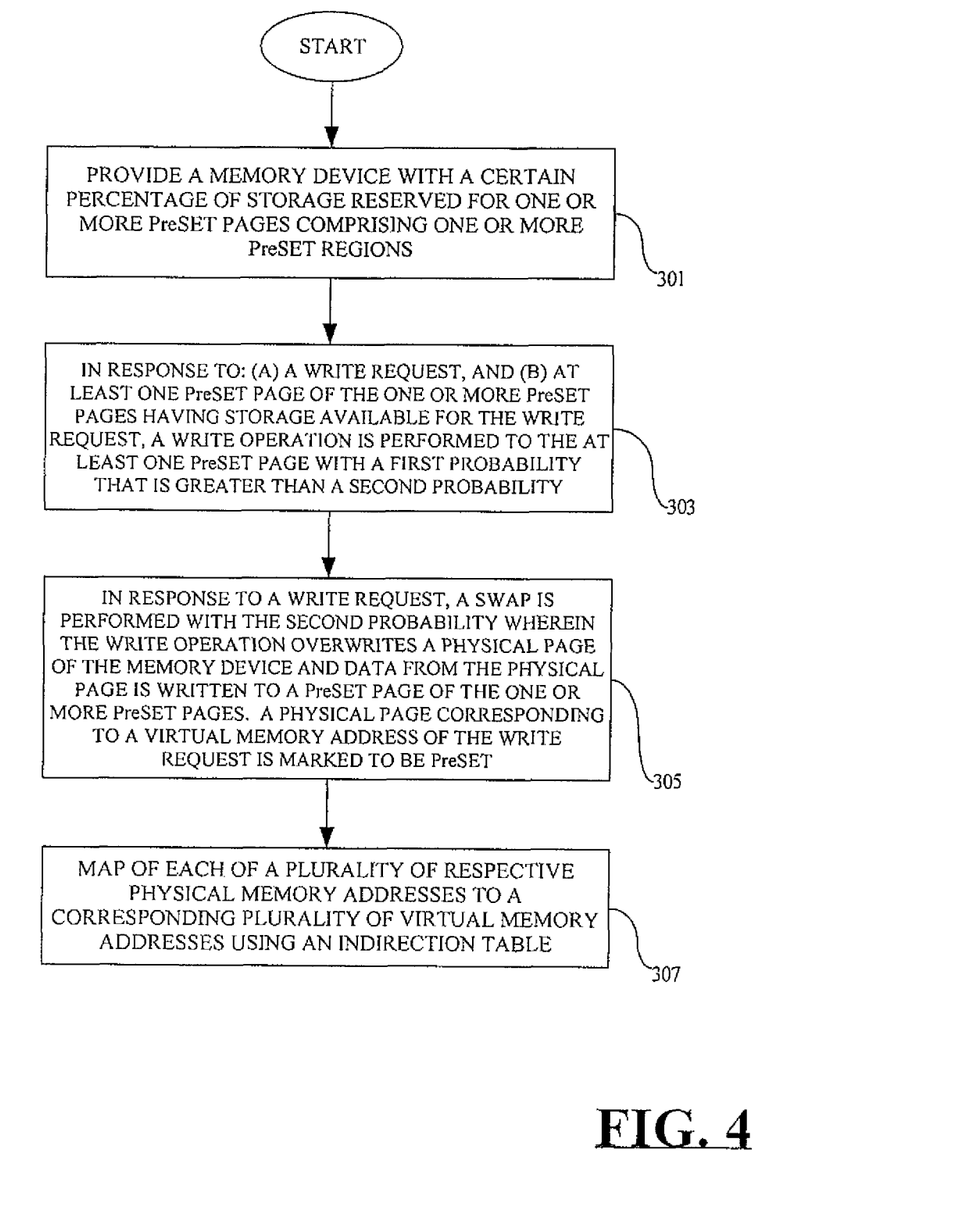
FIG. 4 is a flowchart setting forth a third illustrative method for using one or more PreSET operations to improve write performance according to a set of exemplary embodiments of the invention.

FIG. 4 is a flowchart setting forth a third illustrative method for using one or more PreSET operations to improve write performance according to a set of exemplary embodiments of the invention. This method facilitates wear leveling. Data is written to a PreSET region of memory if memory in the PreSET region is available. With some probability, a swap is performed from the PreSET region to a non-PreSET region. Illustratively, the probability of the swap may depend upon one or more of (a) the static versus dynamic nature of data to be written, as well as (b) line wear and (c) PreSET region wear.

One benefit to this wear-leveling approach is that the PreSET region allows for fast writes. Lines are repeatedly moved into the PreSET region since as a logical address is written, a previous physical page corresponding to the logical address is added to the PreSET region. If the write pattern is such that a few addresses are frequently written, the region spanned by these addresses may capture most of the writes. The approach of FIG. 4 provides effective wear-leveling by ensuring that addresses from outside the PreSET region can enter the PreSET region, illustratively at random. The probability of the swap can be appropriately tuned for effective wear leveling.

The operational sequence of FIG. 4 commences at block 301. A memory device, illustratively a PCM, is provided with a certain percentage or portion of storage reserved for one or more PreSET pages. These one or more PreSET pages comprise the one or more PreSET regions. Next, at block 303, in response to (a) a write request, and (b) at least one PreSET page of the one or more PreSET pages having storage available for the write request, a write operation is performed to the at least one PreSET page with a first probability that is greater than a second probability. At block 305, in response to a write request, a swap is performed with the second probability wherein the write operation overwrites a physical page of the PCM memory and data from the physical page is written to a PreSET page of the one or more PreSET pages. A physical page corresponding to a virtual memory address of the write request is marked to be PreSET.

Optionally or alternatively, the overwritten physical page contained data corresponding to a virtual memory address which was previously written, and thus the data does not need to be written to the PreSET page. The first probability is a function of one or more factors including page health and whether the data is relatively static versus relatively dynamic. The operational sequence progresses to block 307 where an indirection table tracks mapping of each of a plurality of respective physical memory addresses to a corresponding plurality of virtual memory addresses.

Figure 5:
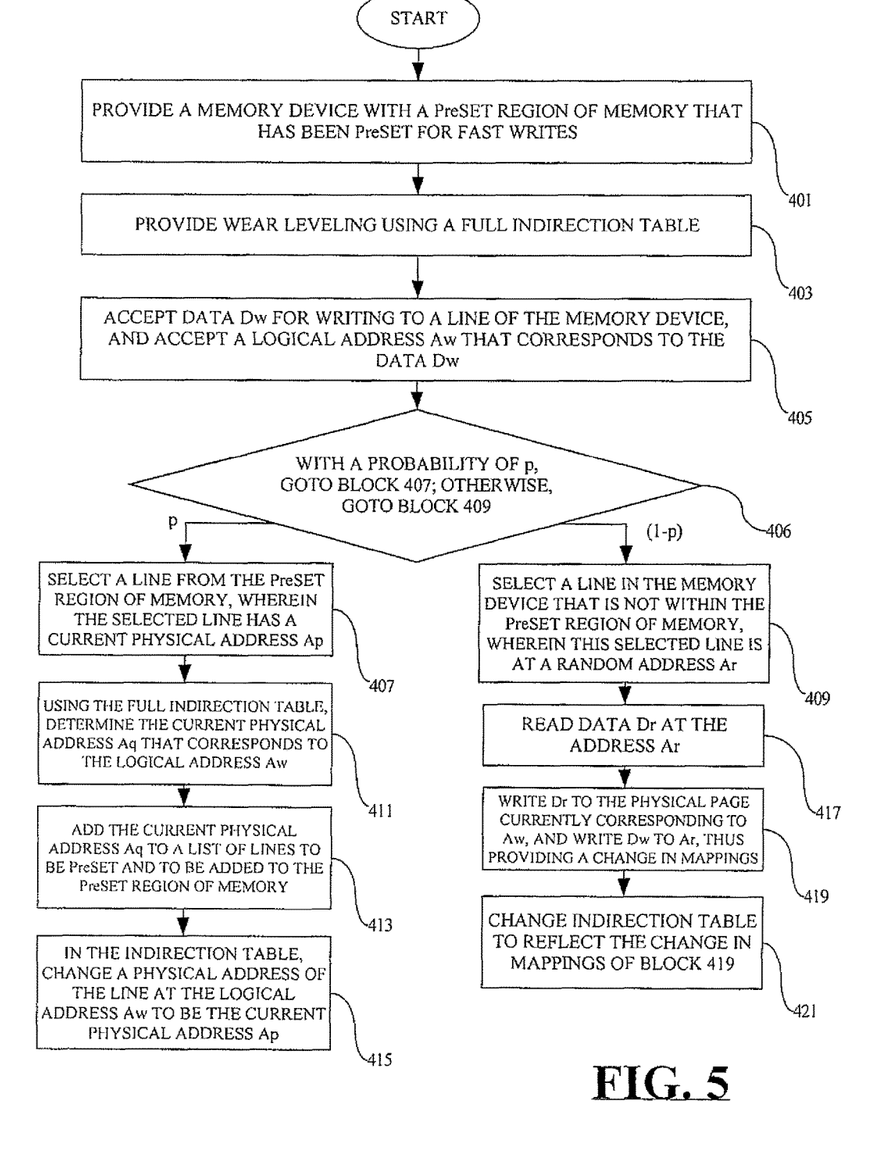
FIG. 5 is a flowchart setting forth a fourth illustrative method for using one or more PreSET operations to improve write performance according to a set of exemplary embodiments of the invention.

FIG. 5 is a flowchart setting forth a fourth illustrative method for using one or more PreSET operations to improve write performance according to a set of exemplary embodiments of the invention. A memory device is provided with a PreSET region of memory that has been PreSET for fast writes (block 401). Wear leveling of the memory device is provided using a full indirection table (block 403). The indirection table is used to track mapping of each of a respective plurality of logical addresses of the memory device to a corresponding physical address of a plurality of physical addresses of the memory device. This indirection table may be full or partial. At block 405, data Dw is accepted for writing to a line of the memory device, and a logical address Aw is accepted corresponding to the data Dw. At block 406, with a probability p less than one, the operational sequence of FIG. 5 progresses to block 407. Otherwise, with a probability of (1−p), the operational sequence of FIG. 5 progresses to block 409. According to a set of illustrative embodiments of the invention, p is closer to 1 than to 0 such that p is greater than 0.5, but less than 1.0. According to a set of further illustrative embodiments of the invention, p is between 0.9 and 1.0.

At block 407, a line is selected from the PreSET region of memory, wherein the selected line has a physical address Ap. Using the full indirection table, determine a current physical address corresponding to the logical address Aw (block 411). Add the physical address to a list of lines to be PreSET and to be added to the PreSET region of memory (block 413). At block 415, the physical address of the line at the logical address Aw in the indirection table is changed to be the physical address Ap.

With the probability of (1−p), the operational sequence progresses from block 406 to block 409. A line in the memory device is selected that is not within the PreSET region of memory. This line is at a random address Ar. Next, at block 417, data Dr at the address Ar is read. Then Dr is written to Aw and Dw is written to Ar (block 419). At block 421, the indirection table is changed to reflect the change in mappings that was performed at block 419.

One philosophy underlying the operational sequence of FIG. 5 is that the PreSET region allows for fast writes. Lines are moved into the PreSET region by virtue of the fact that, as one writes to any address, that address is scheduled to be added to the PreSET region. Nonetheless, if the write pattern is such that a few addresses get written to very frequently, then these addresses will effectively not leave the PreSET region, and hence may be continuously written according to the operations of blocks 409, 417, 419 and 421. The probability p may be tuned to ensure that the rate at which new lines enter the PreSET region is sufficiently high so that the lines are effectively wear-leveled.

Any of the methods of FIGS. 2-5 may utilize an indirection table that stores a logical to physical mapping of the lines of the memory device. The storage overhead of the indirection table can be reduced by having a limited indirection wherein most of the lines are located in their original locations and only a small fraction of all lines are located out of place. In such scenarios, the small indirection table keeps track of out-of-place lines which are able to use lines that have already been PreSET. When the table becomes full, the line must be relocated to its original position to create space for other lines that are able to leverage PreSET.

As should be appreciated by one skilled in the art, aspects of the present invention may be embodied as a method, a computer-readable memory, a data processing system, a semiconductor device, or as a combination of these. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit", "device", "module" or "system". Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (anon-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document a computer readable storage medium may be any tangible, non-transitory medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the computer, partly on the computer, as a stand-alone software package, partly on the computer and partly on a remote computer or entirely on the remote computer or server. In the latter scenario, the remote computer may be connected to the computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, devices, apparatuses, systems and computer program products according to embodiments of the invention.

It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent mathematical expressions may be used by those skilled in the art. However, all such and similar modifications of the teachings of this invention will still fall within the scope of this invention.

What is claimed is:

1. A method comprising:
providing a PreSET region in a non-transitory memory device wherein the PreSET region includes one or more lines of the memory device which have been PreSET;
performing a write operation on one or more out of place lines of the memory device by writing to the PreSET region instead of writing to an in place line of the memory device, wherein a swap is performed, such that the write operation overwrites a physical page of the memory device, data from the physical page is written to a PreSET page of the PreSET region, and a physical page corresponding to a virtual memory address of the write request is marked to be PreSET; and
storing in an indirection table a mapping of each of a respective plurality of logical pages of the memory device to a corresponding physical page of a plurality of physical pages of the memory device, wherein the indirection table keeps track of the one or more out of place lines.

2. The method of claim 1 wherein the performing of the write operation on the one or more out of place lines is performed in response to a heavy write load.

3. The method of claim 2 wherein the performing of the write operation on the one or more out of place lines is performed in response to a current occupancy level of a write queue being above a specified threshold.

4. The method of claim 1 wherein the performing of the write operation includes writing data, using an indirection table specifying a mapping from logical to physical addresses, to one or more physical pages of memory in a virtual address space instead of writing to the one or more lines in the PreSet region, in response to a current occupancy level of a write queue being at or below a specified threshold.

5. The method of claim 1 wherein, in response to the indirection table becoming full, the one or more out of place lines are relocated to an original or former position that is not out of place.

6. The method of claim 1 wherein the memory device is provided with a specified percentage of storage reserved for one or more PreSET pages comprising one or more PreSET regions.

7. The method of claim 6 wherein, in response to: (a) a write request, and (b) at least one PreSET page of the one or more PreSET pages having storage available for the write request, a write operation is performed to the at least one PreSET page with a first probability that is greater than a second probability.

8. The method of claim 7 wherein, in response to a write request, the swap is performed with the second probability.

9. A computer program product embodied on a non-transitory computer-readable memory that contains computer program instructions, where the execution of the computer program instructions by at least one data processor results in performance of operations that comprise:
providing a PreSET region in a non-transitory memory device wherein the PreSET region includes one or more lines of the memory device which have been PreSET;
performing a write operation on one or more out of place lines of the memory device by writing to the PreSET region instead of writing to an in place line of the memory device, wherein a swap is performed, such that the write operation overwrites a physical page of the memory device, data from the physical page is written to a PreSET page of the PreSET region, and a physical page corresponding to a virtual memory address of the write request is marked to a PreSET; and
storing in an indirection table a mapping of each of a respective plurality of logical pages of the memory device to a corresponding physical page of a plurality of physical pages of the memory device, wherein the indirection table keeps track of the one or more out of place lines.

10. The computer-readable memory of claim 9 further comprising computer program instructions for performing the write operation on the one or more out of place lines in response to a heavy write load.

11. The computer-readable memory of claim 10 further comprising computer program instructions for performing the write operation on the one or more out of place lines in response to a current occupancy level of a write queue being above a specified threshold.

12. The computer-program product of claim 9 further comprising computer program instructions for performing the write operation by writing data to one or more physical pages of memory in a virtual address space instead of writing to the one or more out of place lines, in response to a current occupancy level of a write queue being at or below a specified threshold.

13. The computer program product of claim 9 further comprising computer program instructions for relocating the one or more out of place lines to an original or former position that is not out of place, in response to the indirection table becoming full.

14. The computer program product of claim 9 further comprising computer program instructions for providing the memory device with a specified percentage of storage reserved for one or more PreSET pages comprising one or more PreSET regions.

15. The computer-readable memory of claim 14 further comprising computer program instructions for performing a write operation to the at least one PreSET page with a first probability that is greater than a second probability, in response to: (a) a write request, and (b) at least one PreSET page of the one or more PreSET pages having storage available for the write request.

16. The computer program product of claim 15 further comprising computer program instructions for performing the swap with the second probability in response to a write request.

17. A data processing system that comprises at least one data processor connected with at least one memory that stores computer program instructions for:
providing a PreSET region in a memory device wherein the PreSET region includes one or more lines of the memory device which have been PreSET;
performing a write operation on one or more out of place lines of the memory device by writing to the PreSET region instead of writing to an in place line of the memory device, wherein a swap is performed, such that the write operation overwrites a physical page of the memory device, data from the physical page is written to a PreSET page of the PreSET region, and a physical page corresponding to a virtual memory address of the write request is marked to be PreSET; and
storing in an indirection table a mapping of each of a respective plurality of logical pages of the memory device to a corresponding physical page of a plurality of physical pages of the memory device, wherein the indirection table keeps track of the one or more out of place lines.

18. The data processing system of claim 17 further comprising computer program instructions for performing the write operation on the one or more out of place lines in response to a heavy write load.

19. The data processing system of claim 18 further comprising computer program instructions for performing the write operation on the one or more out of place lines in response to a current occupancy level of a write queue being above a specified threshold.

20. The data processing system of claim 17 further comprising computer program instructions for performing the write operation by writing data to one or more physical pages of memory in a virtual address space instead of writing to the one or more out of place lines, in response to a current occupancy level of a write queue being at or below a specified threshold.

21. The data processing system of claim 17 further comprising computer program instructions for relocating the one or more out of place lines to an original or former position that is not out of place, in response to the indirection table becoming full.

22. The data processing system of claim 17 further comprising computer program instructions for providing the memory device with a specified percentage of storage reserved for one or more PreSET pages comprising one or more PreSET regions.

23. The data processing system of claim 22 further comprising computer program instructions for performing a write operation to the at least one PreSET page with a first probability that is greater than a second probability, in response to: (a) a write request, and (b) at least one PreSET page of the one or more PreSET pages having storage available for the write request.

24. The data processing system of claim 23 further comprising computer program instructions for performing the swap with the second probability in response to the write request.

* * * * *